US012580028B2

(12) United States Patent
Cerafogli et al.

(10) Patent No.: US 12,580,028 B2
(45) Date of Patent: Mar. 17, 2026

(54) COMPACT DIGITAL THERMOMETER IN A MEMORY DEVICE

(71) Applicant: Micron Technology, Inc., Boise, ID (US)

(72) Inventors: Chiara Cerafogli, Boise, ID (US); Kenneth William Marr, Boise, ID (US); Marco Domenico Tiburzi, Avezzano (IT); Matthew Joseph Iriondo, Boise, ID (US); Warren Lee Boyer, Boise, ID (US); Brian James Soderling, Eagle, ID (US); James Eric Davis, Meridian, ID (US); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 18/489,770

(22) Filed: Oct. 18, 2023

(65) Prior Publication Data

US 2024/0136000 A1     Apr. 25, 2024
US 2024/0233839 A9     Jul. 11, 2024

Related U.S. Application Data

(60) Provisional application No. 63/417,636, filed on Oct. 19, 2022.

(51) Int. Cl.
*G11C 16/32* (2006.01)
*G01K 13/00* (2021.01)

(52) U.S. Cl.
CPC .............. *G11C 16/32* (2013.01); *G01K 13/00* (2013.01)

(58) Field of Classification Search
None
See application file for complete search history.

(56) References Cited

U.S. PATENT DOCUMENTS

2022/0407459 A1 * 12/2022 Jung ........................ H03K 3/02

* cited by examiner

*Primary Examiner* — Alfredo Bermudez Lozada
(74) *Attorney, Agent, or Firm* — Lowenstein Sandler LLP

(57) ABSTRACT

A digital thermometer includes a first oscillator to generate a first clock signal, wherein a period of this clock signal remains constant in view of temperature changes of the apparatus and a first counter coupled to the first oscillator, this counter to count a fixed number of cycles of the first clock signal associated with a measurement period. The digital thermometer further includes a second oscillator to generate a second clock signal, wherein a period of this clock signal varies with temperature changes and a second counter coupled to the second oscillator, this counter to generate an output representing a count of a number of cycles of the second clock signal that occur during the measurement period. Additionally, the digital thermometer includes calibration circuitry coupled to the second counter, the calibration circuitry to generate, based on the output of the second counter, a value representing the temperature of the apparatus.

20 Claims, 7 Drawing Sheets

500

COMPACT DIGITAL THERMOMETER IN A MEMORY DEVICE

RELATED APPLICATIONS

This application claims the benefit of U.S. Provisional Application No. 63/417,636, filed Oct. 19, 2022, the entire contents of which are hereby incorporated by reference herein.

TECHNICAL FIELD

Embodiments of the disclosure relate generally to memory sub-systems, and more specifically, relate to a compact digital thermometer in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
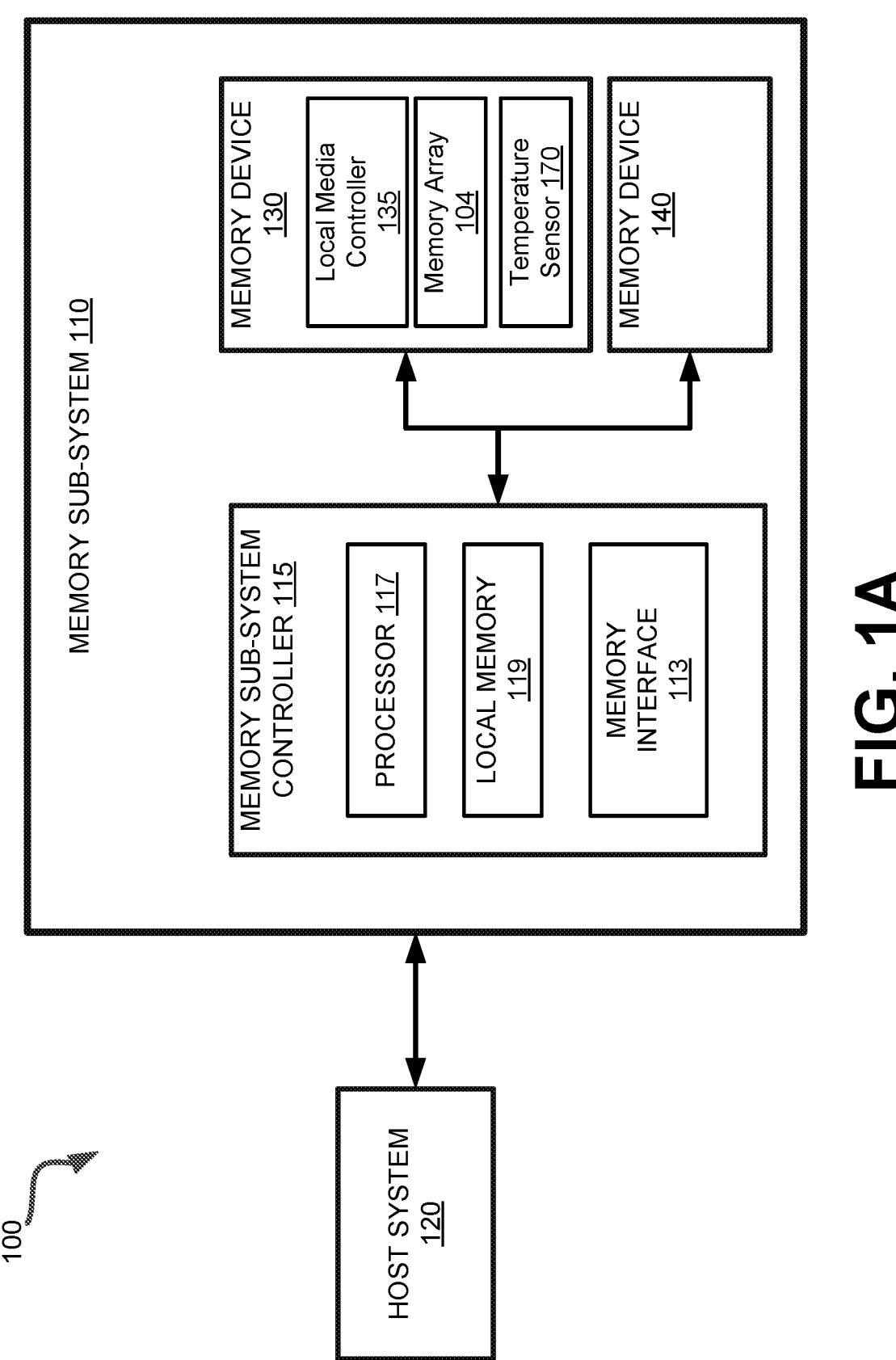
FIG. 1A illustrates an example computing system that includes a memory sub-system in accordance with some embodiments of the present disclosure.

Aspects of the present disclosure are directed to a compact digital thermometer in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Bit flip errors can occur in certain memory devices when there is not enough separation between respective threshold voltages ($V_t$) of two adjacent bit levels (also referred to as "states"). Typically, each binary value stored in a memory cell has a different associated threshold voltage, with the lowest binary value having the highest threshold voltage, the highest binary value having the lowest threshold voltage, and intermediate states having progressively different threshold voltage values. For example, a memory cell configured as triple level cell (TLC) memory can have eight states, with each state having a corresponding $V_t$. Similarly, a memory cell configured as quad level cell (QLC) memory can have 16 states, with each state having a corresponding $V_t$. In certain memory devices, bit flip errors can be reduced (e.g., minimized) through providing a better separation of levels in a threshold voltage ($V_t$) distribution. The separation between two adjacent levels is reduced, however, when more bits are stored per memory cell.

In many memory devices, the level separation in threshold voltages becomes further reduced (or shifted) due to changes in environmental conditions, such as cross-temperature effects. Cross temperature negatively impacts level separation in situations where the memory cell operates (e.g., is read) at a temperature range which is different from a temperature at which the memory cell was programmed. For example, cross temperature effects can arise when data is read from a memory cell at a temperature that is different from the temperature at which data was written into the memory cell. Cross-temperature-induced errors can be accumulated by one or both of shifted levels that cross thresholds boundaries causing bit flip errors and/or overlapping levels causing increased number of bit flip errors. Bit flip errors reduce reliability and data retention capability as a result of the increased error rate. As the difference between a data write temperature and a data read temperature increases, so does the error rate of the data as a result of level shift and level overlap.

Certain memory devices and memory sub-systems attempt to reduce the error rates using a variety of techniques, including adjusting the read voltage level. This can include determining a temperature compensation offset value to account for a given memory cell's shift in threshold voltage. In order to accurately determine this temperature compensation offset, an accurate temperature measurement for the memory device and/or memory sub-system is needed. Certain memory devices implement a temperature sensor on the memory die that is based on a successive approximation register (SAR) architecture. Such a temperature sensor uses analog signals sampled to obtain a digital code which is used for internal temperature compensation. The design of these temperature sensors, however, is relatively complex and large in size, and is also subject to errors due to noise propagation in the memory device.

Aspects of the present disclosure address the above and other deficiencies by providing compact digital thermometer in a memory device of a memory sub-system. Depending on the embodiment, the thermometer can be implemented directly on a memory die or in some other circuit in the memory sub-system, such as in the memory sub-system controller. In one embodiment, the thermometer includes two oscillators, each having a corresponding counter, and associated calibration circuitry. A first oscillator can generate a constant with absolute temperature (CWT) clock signal, the period of which remains constant with changes in temperature. The corresponding counter can count a certain number of cycles of this CWT clock signal, which is used to define a measurement period. A second oscillator can generate a proportional to absolute temperature (PTAT) or complimentary to absolute temperature (CTAT) clock signal, the period of which varies with changes in temperature. For ease of explanation, in some examples described herein, the second oscillator is described as generating a PTAT clock signal, although it should be understood that in other embodiments, the second oscillator can generate either a PTAT or a CTAT clock signal. The corresponding counter can count a number of cycles of this PTAT or CTAT clock signal that occur during the measurement period. This number of cycles, once calibrated by the calibration circuitry, can be used as a digital temperature code (i.e., a Thermobit) that represents the current temperature in the memory device or memory sub-system. The thermometer can provide this digital temperature code to corresponding control logic, which can determine an appropriate temperature compensation offset value to be used in performing memory access operation on the memory device.

Advantages of this approach include, but are not limited to, improved performance in the memory sub-system. The techniques described herein provide a compact digital thermometer that accurately determines the temperature of the memory device. Such a design is lower in complexity and smaller in area, allowing for decreased size of the memory die. The accuracy of the temperature measurements made by the thermometer are comparable to that of other designs, which allows for improved temperature compensation leading to fewer errors and reduced triggering of error handling protocols.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local media controller 135, memory array 104, and temperature sensor 170 (e.g., a compact digital thermometer). As described herein, the memory array 104 can be logically or physically divided into a number of segments (e.g., dies, blocks, pages, etc.). When a memory access operation is performed on one of those segments of memory array 104, local media controller 135 can request a current temperature reading from the temperatures senor 170 and can identify an appropriate temperature compensation value, based on the current temperature reading, to be used in performance of the memory access operation. For example, local media controller 135 can adjust a read voltage level (e.g., apply a read voltage offset to a default read voltage level) based on the current temperature, or on a cross-temperature value (i.e., the difference between the current temperature and a temperature at which the data was programmed to memory array 104). Depending on the embodiment, temperature sensor 170 in memory device 130 could instead provide the temperature reading to memory sub-system controller 115 to perform any required temperature compensation, or the temperature sensor 170 could be located elsewhere in memory sub-system 110, such as within memory sub-system controller 115 itself. Further details with regards to the design and operation of temperature sensor 170 are described below.

Figure 1B:
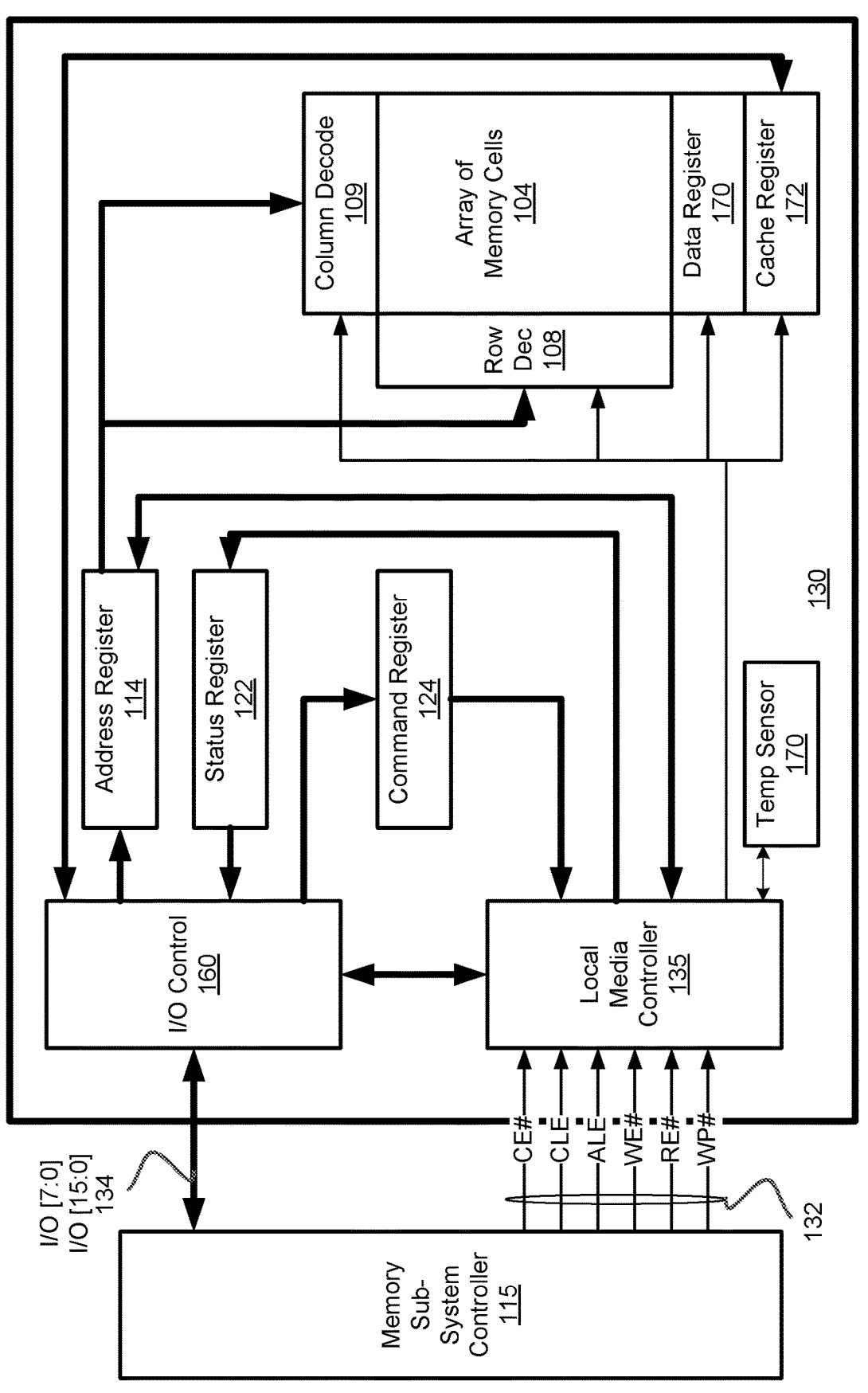
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 is in communication with a temperature sensor 170 disposed within or adjacent to memory device 130. Temperature sensor 170 can be used to measure an ambient temperature at certain points in time, which can represent, for example, a write temperature or a read temperature.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
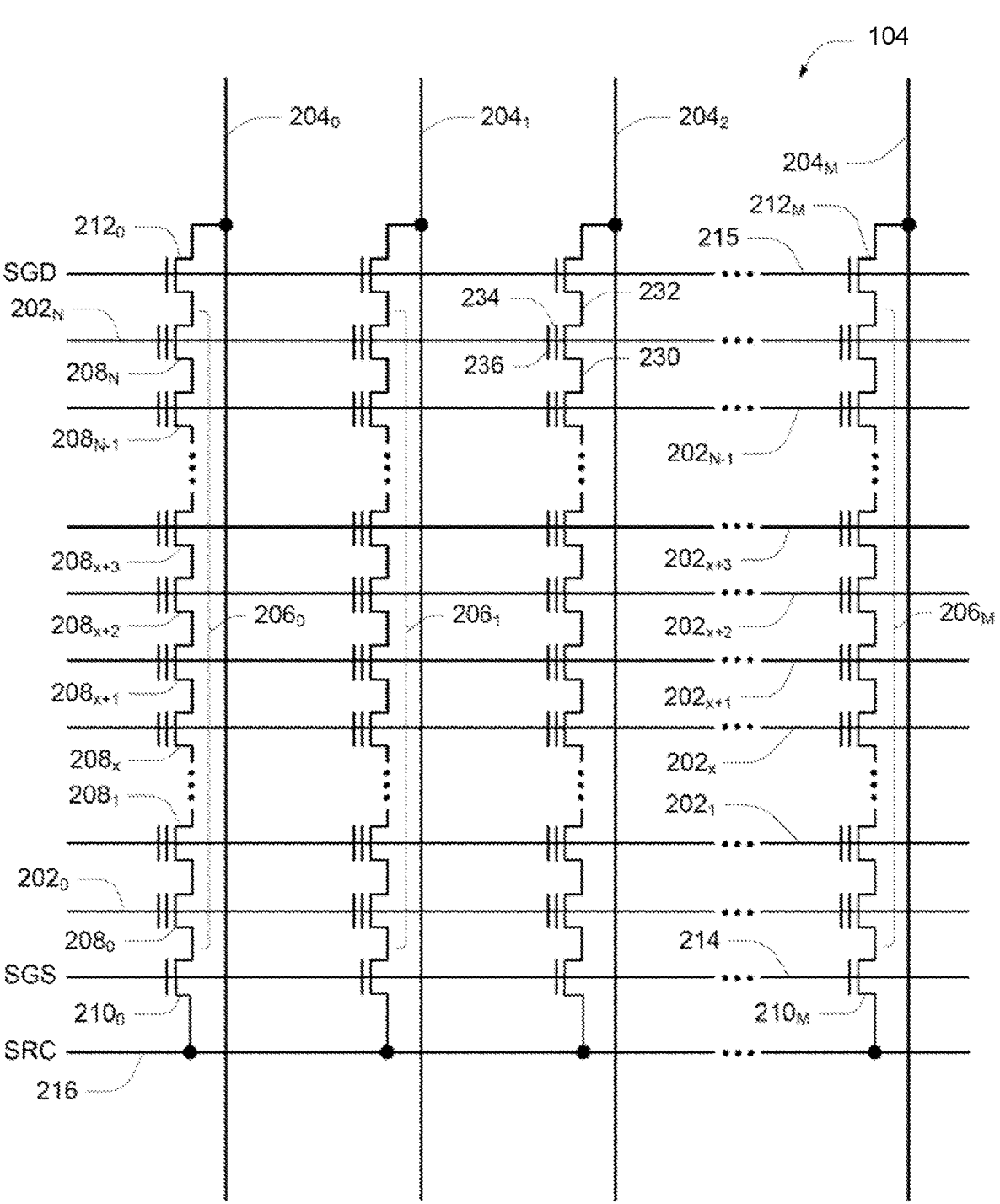
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
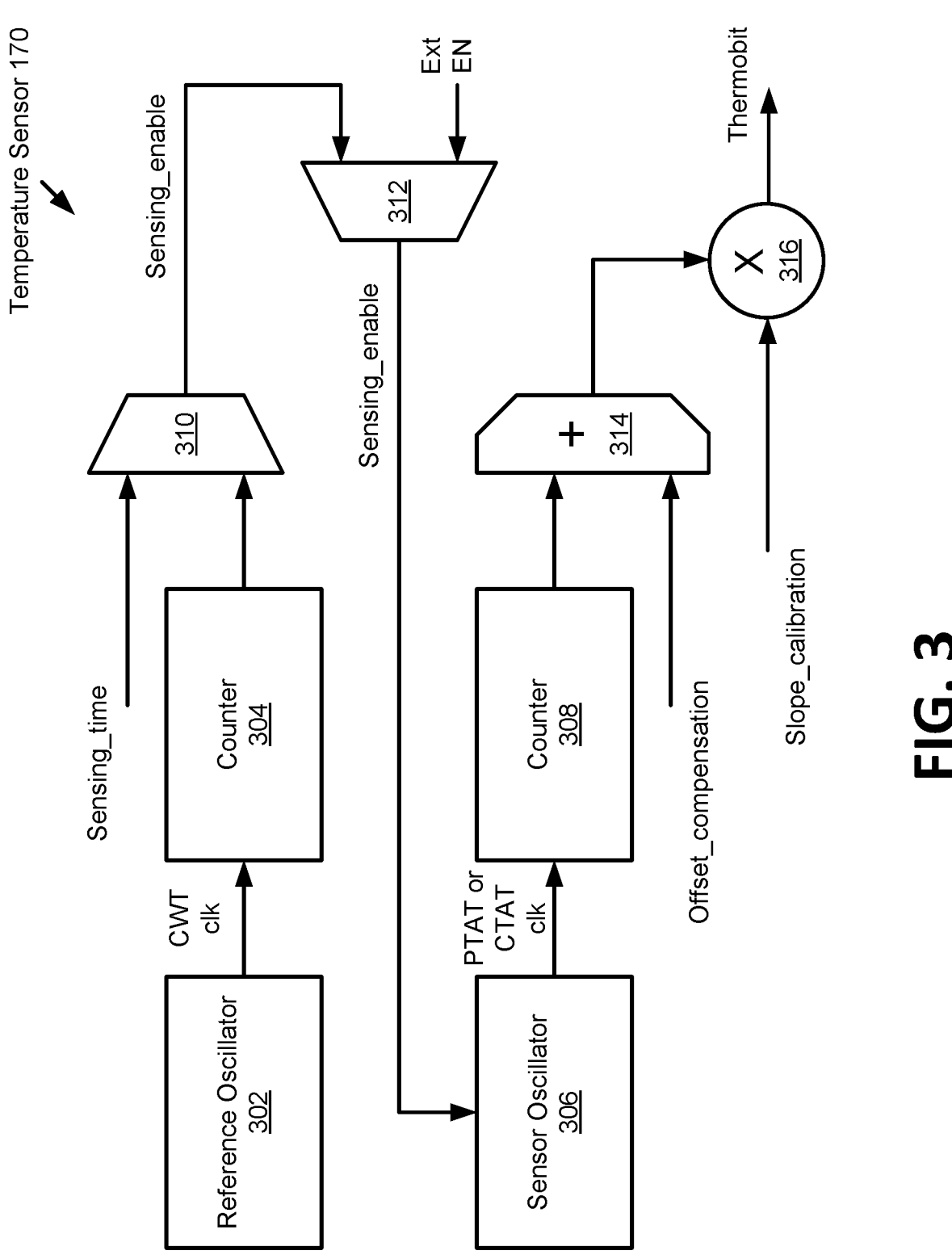
FIG. 3 is a block diagram illustrating a compact digital thermometer in a memory device in accordance with some embodiments of the present disclosure.

FIG. 3 is a block diagram illustrating a compact digital thermometer in a memory device in accordance with some embodiments of the present disclosure. The compact digital thermometer can be embodied as temperature sensor 170, as shown in FIG. 1A and FIG. 1B. In other embodiment, the compact digital thermometer can be implemented in some other system, circuit, device, or environment.

In one embodiment, temperature sensor 170 includes two oscillators 302 and 306, each having a corresponding counter 304 and 308, and associated calibration circuitry. A first oscillator, such as reference oscillator 302, can generate a constant with absolute temperature (CWT) clock signal, the period of which remains constant with changes in temperature. Reference oscillator 302 can be activated by a corresponding control signal (not shown). The corresponding counter 304 can count a certain number of cycles of this CWT clock signal, which is used to define a measurement period. In one embodiment, this fixed number of cycles is defined by a trim setting called "sensing_time". Temperature sensor 170 can include a comparator 310, which compares the current count value from counter 304 to the fixed number of cycles. While the count value from counter 304 remains below the fixed number of cycles, comparator 310 can provide an output signal "sensing_enable" which indicates that the measurement period is currently active. When the count value from counter 304 reaches the fixed number of cycles, comparator 310 can deactivate the output signal. In one embodiment, the output signal "sensing_enable" is provided as one input to a multiplexer 312. When an external enable signal "Ext_EN" is provided, the multiplexer 312 will pass the output signal "sensing_enable" to sensor oscillator 306. When the external enable signal "Ext_EN" is not provided, the multiplexer 312 will not pass the output signal. This enables external control logic to control activation of the temperature sensor 170 as needed.

When the signal "sensing_enable" is provided, sensor oscillator 306 can generate a proportional to absolute temperature (PTAT) clock signal or complimentary to absolute temperature (CTAT) clock signal, the period of which varies with changes in temperature. For example, the frequency of the PTAT clock can increase as temperature increases, meaning that the corresponding period would decrease. Similarly, the frequency of the PTAT clock can decrease as temperature deceases, meaning that the corresponding period would increase. The inverse is true for a CTAT clock signal. The corresponding counter 308 can count a number of cycles of this PTAT or CTAT clock that occur during the measurement period. As noted above, the signal "sensing_enable" is deactivated at the end of the measurement period, thereby preventing sensor oscillator 306 from generating additional PTAT or CTAT clock cycles. This number of cycles (i.e., the output of counter 308), once calibrated by the calibration circuitry, can be used as a digital temperature code (i.e., a Thermobit) that represents the current temperature in the memory device or memory sub-system. Since the PTAT clock is proportional to temperature, a higher number of cycles counted during the measurement period represents a higher temperature, while a lower number of cycles counted during the measurement period represents a lower temperature. The inverse is true for a CTAT clock signal.

In one embodiment, the compensation circuitry includes adder circuit 314 and multiplier circuit 316. In one embodiment, adder circuit 314 receives the output of counter 308 and adds to that value, an offset compensation value "offset_compensation". The output of adder circuit 314 is provided to multiplier circuit 316, which multiplies that value with a slope calibration value "slope_calibration". The output of multiplier circuit 316 is the thermobit value representing the calibrated temperature measured by the temperature sensor 170. The temperature sensor 170 can provide this thermobit (i.e., a digital temperature code) to corresponding control logic, which can decode the thermobit to determine the measured temperature.

Figure 4:
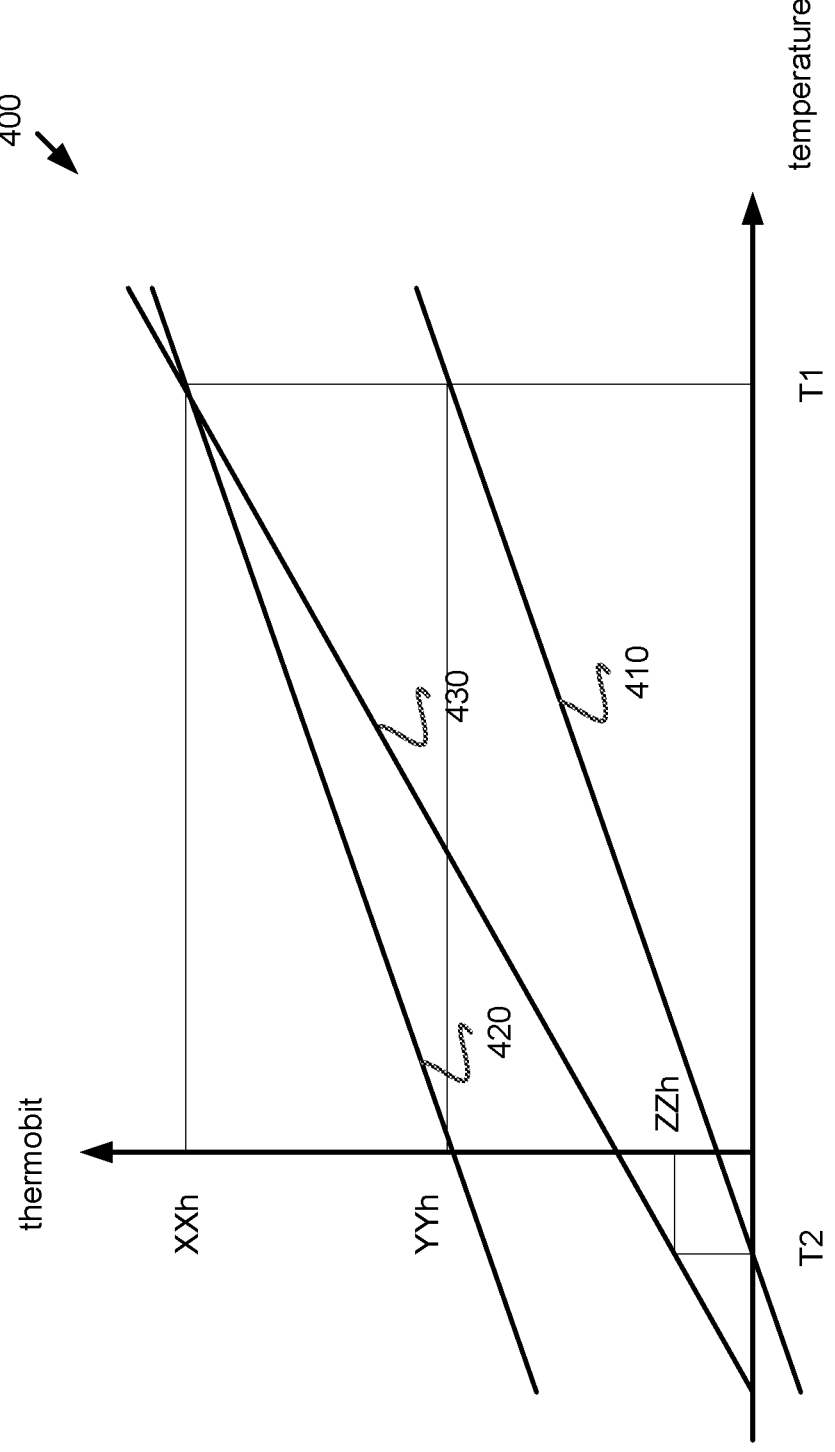
FIG. 4 is a graph illustrating calibration in a compact digital thermometer in accordance with some embodiments of the present disclosure.

FIG. 4 is a graph illustrating calibration in a compact digital thermometer in accordance with some embodiments of the present disclosure. The graph 400 plots temperature response for a given memory die, such as memory device 130. Given the processing variations inherent in manufacture, different memory die in memory sub-system 110 can have different temperature responses. Line 410 represents the measured temperature response before calibration. For example, at a given temperature T1, the resulting thermobit should have an expected value of XXh. As shown in the graph 400, however, at temperature T1, line 410 is displaying a considerably lower temperature YYh. Thus, it is understood that an offset compensation value is needed to raise the thermobit value in the response at temperature T1. By adding the "offset_compensation" value to the measured count value from counter 308 (e.g., using adder circuit 314) the temperature response over the entire temperature range is raised, and now represented by line 420. The appropriate "offset_compensation" value can be determined by experimentation and can be stored as a pre-configured trim setting in memory device 130 or memory sub-system 110. That temperature response may not be accurate, however, across the entire temperature range. For example, at temperature T2, the resulting thermobit should have an expected value of ZZh. As shown in the graph 400, however, at temperature T2, line 420 is displaying a considerably higher temperature (closer to YYh). Thus, it is understood that a slope calibration value is needed to decrease the thermobit value in the response at temperature T2. By multiplying the "slope_calibration" value to the output of adder circuit 314 (e.g., using multiplier circuit 316) the temperature response over the entire temperature range is calibrated, and now represented by line 430. The appropriate "slope_calibration" value can be determined by experimentation and can be stored as a pre-configured trim setting in memory device 130 or memory sub-system 110.

Figure 5:
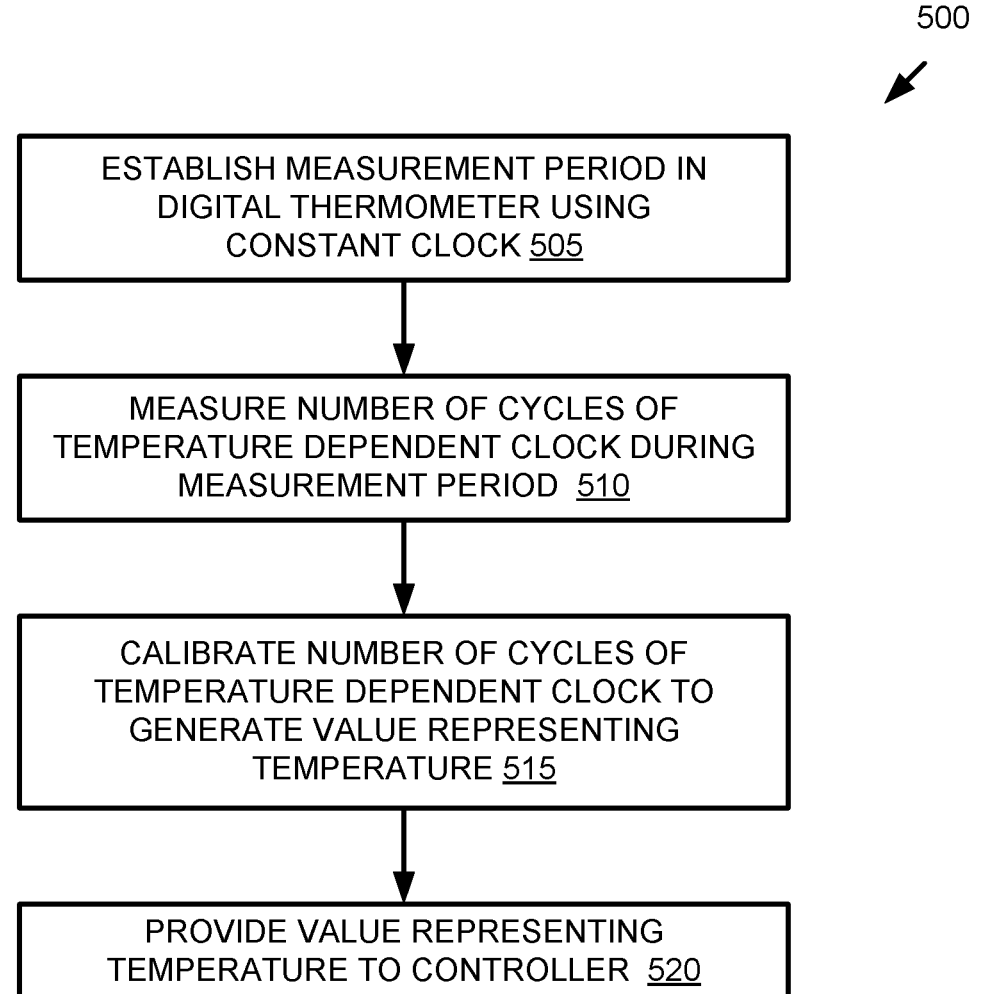
FIG. 5 is a flow diagram of an example method of operating a compact digital thermometer in a memory device in accordance with some embodiments of the present disclosure.

FIG. 5 is a flow diagram of an example method of operating a compact digital thermometer in a memory device in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by temperature sensor 170 (e.g., a digital thermometer) of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a measurement period is established. For example, temperature sensor 170 can establish a measurement period, where the measurement period is defined by a fixed number of cycles of a first clock signal, wherein a period of the first clock signal remains constant in view of changes in temperature. In one embodiment, the first clock signal is generated by reference oscillator 302 of the temperature sensor 170, and the first clock signal comprises a constant with absolute temperature (CWT) clock signal. In one embodiment, to establish the measurement period, the temperature sensor 170 can count a number of cycles of the first clock signal using counter 304 and can compare the number of cycles of the first clock signal (i.e., the output of counter 304) to a trim setting (e.g., sensing_time) representing the fixed number of cycles using comparator 310.

At operation 510, a number of cycles is measured. For example, temperature sensor 170 can measure a number of cycles of a second clock signal during the measurement period, wherein a period of the second clock signal varies with changes in temperature. In one embodiment, the second clock signal is generated by sensor oscillator 306 of the temperature sensor 170, and the second clock signal comprises a proportional to absolute temperature (PTAT) clock signal or complimentary to absolute temperature (CTAT) clock signal. In one embodiment, counter 308 can count the number of cycles of the PTAT or CTAT clock signal output by sensor oscillator 306.

At operation 515, a calibration is performed. For example, temperature sensor 170 can calibrate the number of cycles of the second clock signal to generate a value representing the temperature (e.g., a thermobit). In one embodiment, to calibrate the number of cycles of the second clock signal, the temperature sensor 170 can add an offset compensation value to the number of cycles of a second clock signal during the measurement period (i.e., the output of counter 308) using adder circuit 314 to generate an intermediate calibration result, and can multiply the intermediate calibration result by a slope calibration value using multiplier circuit 316 to generate the value representing the temperature.

At operation 520, the value is provided to a controller. For example, temperature sensor 170 can provide the value representing the temperature to a controller associated with memory device 130, such as local media controller 135 or memory sub-system controller 115. That controller is to configure one or more operating parameters of the memory device 130 based on the temperature. The operating parameters can include, for example, a read-voltage offset, a pre-charge time, a sensing time, or other parameters. Using the configured operating parameters, the controller can perform one or more memory access operations, such as a read operation, program operation, erase operation, etc., or media management operations, such as a wear-leveling operation, a garbage collection operation, etc.

Figure 6:
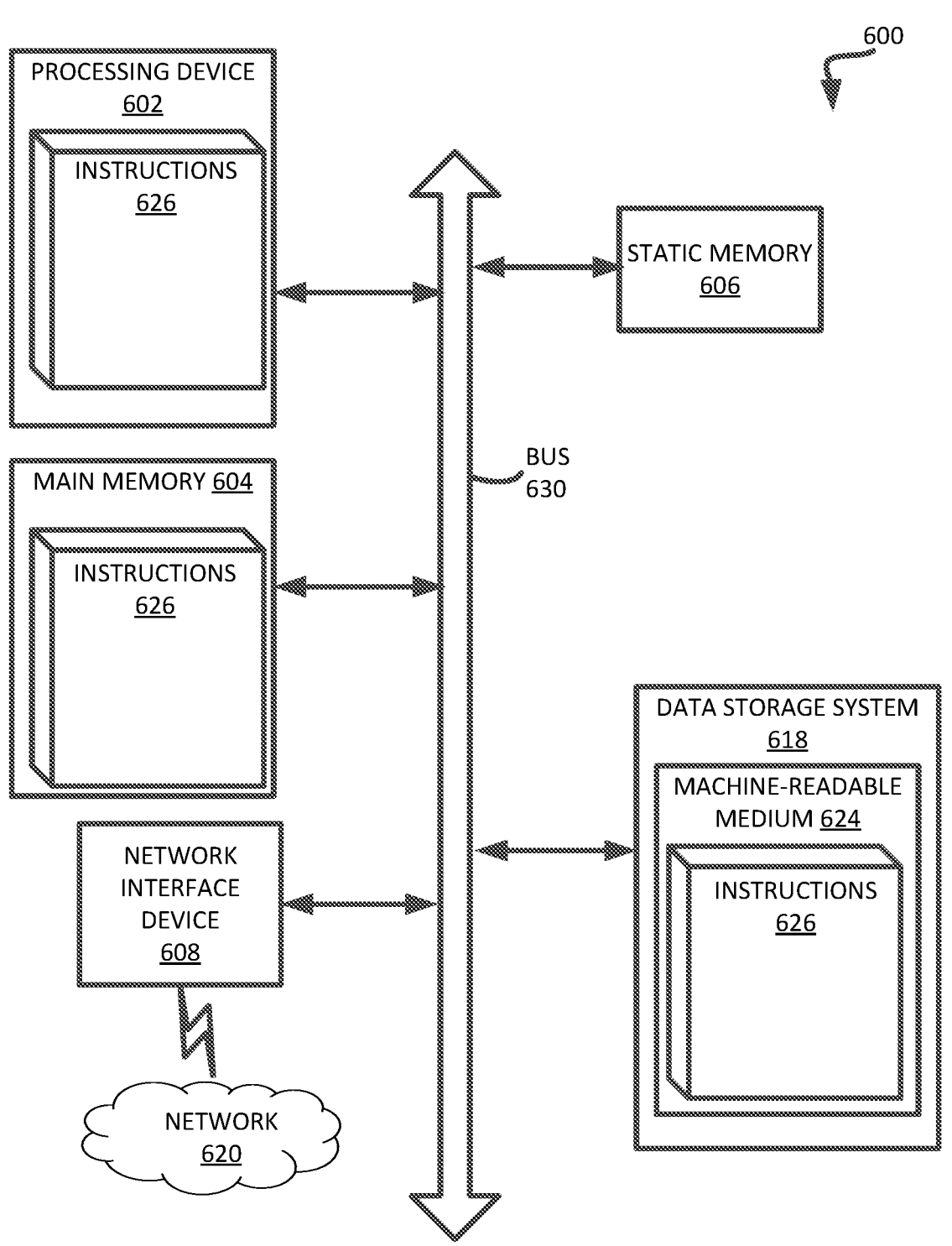
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the local media controller 135 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
a first oscillator to generate a first clock signal, wherein a period of the first clock signal remains constant in view of changes in a temperature of the apparatus;
a first counter coupled to the first oscillator, the first counter to count a fixed number of cycles of the first clock signal associated with a measurement period;
a second oscillator to generate a second clock signal, wherein a period of the second clock signal varies with changes in the temperature;
a second counter coupled to the second oscillator, the second counter to generate an output representing a count of a number of cycles of the second clock signal that occur during the measurement period; and
calibration circuitry coupled to the second counter, the calibration circuitry to generate, based on the output of the second counter, a value representing the temperature of the apparatus.

2. The apparatus of claim 1, wherein the first oscillator comprises a reference oscillator, and wherein the first clock signal comprises a constant with absolute temperature (CWT) clock signal.

3. The apparatus of claim 1, wherein the second oscillator comprises a sensor oscillator, and wherein the second clock signal comprises at least one of a proportional to absolute temperature (PTAT) clock signal or a complementary to absolute temperature (CTAT) clock signal.

4. The apparatus of claim 1, further comprising:

a comparator coupled to the first counter, the comparator to compare an output of the first counter representing a count of a number of cycles of the first clock signal to a trim setting representing the fixed number of cycles, wherein the comparator is to generate a sensing enable signal to enable the second oscillator during the measurement period.

5. The apparatus of claim 1, wherein the calibration circuitry comprises an adder circuit, the adder circuit to add an offset compensation value to the output of the second counter.

6. The apparatus of claim 5, wherein the calibration circuitry further comprises a multiplier circuit, the multiplier circuit to multiply an output of the adder circuit by a slope calibration value, and wherein an output of the multiplier circuit comprises the value representing the temperature of the apparatus.

7. The apparatus of claim 1, wherein the apparatus comprises a digital thermometer disposed within a memory device, and wherein the temperature of the apparatus comprises an operating temperature of the memory device.

8. The apparatus of claim 7, wherein the calibration circuitry is to provide the value representing the temperature of the apparatus to a controller associated with the memory device, wherein the controller is to configure one or more operating parameters of the memory device based on the temperature of the apparatus.

9. A method comprising:

establishing a measurement period in a digital thermometer, wherein the measurement period is defined by a fixed number of cycles of a first clock signal, wherein a period of the first clock signal remains constant in view of changes in temperature;

measuring a number of cycles of a second clock signal during the measurement period, wherein a period of the second clock signal varies with changes in temperature; and generating, based on the number of cycles of the second clock signal, a value representing the temperature.

10. The method of claim 9, wherein the first clock signal is generated by a reference oscillator of the digital thermometer, and wherein the first clock signal comprises a constant with absolute temperature (CWT) clock signal.

11. The method of claim 9, wherein the second clock signal is generated by a sensor oscillator of the digital thermometer, and wherein the second clock signal comprises at least one of a proportional to absolute temperature (PTAT) clock signal or a complementary to absolute temperature (CTAT) clock signal.

12. The method of claim 9, wherein establishing the measurement period in the digital thermometer comprising counting a number of cycles of the first clock signal and comparing the number of cycles of the first clock signal to a trim setting representing the fixed number of cycles.

13. The method of claim 9, wherein calibrating the number of cycles of the second clock signal comprises adding an offset compensation value to the number of cycles of a second clock signal during the measurement period to generate an intermediate calibration result, and multiplying the intermediate calibration result by a slope calibration value to generate the value representing the temperature.

14. The method of claim 9, wherein the digital thermometer is disposed within a memory device, and the method further comprising:

providing the value representing the temperature to a controller associated with the memory device, wherein the controller is to configure one or more operating parameters of the memory device based on the temperature.

15. A memory device comprising:

a memory array;

control logic, operatively coupled with the memory array; and a digital thermometer, operatively coupled with the control logic, to perform operations comprising:

establishing a measurement period in the digital thermometer, wherein the measurement period is defined by a fixed number of cycles of a first clock signal, wherein a period of the first clock signal remains constant in view of changes in temperature;

measuring a number of cycles of a second clock signal during the measurement period, wherein a period of the second clock signal varies with changes in temperature; and generating, based on the number of cycles of the second clock signal, a value representing the temperature.

16. The memory device of claim 15, wherein the first clock signal is generated by a reference oscillator of the digital thermometer, and wherein the first clock signal comprises a constant with absolute temperature (CWT) clock signal.

17. The memory device of claim 15, wherein the second clock signal is generated by a sensor oscillator of the digital thermometer, and wherein the second clock signal comprises at least one of a proportional to absolute temperature (PTAT) clock signal or a complementary to absolute temperature (CTAT) clock signal.

18. The memory device of claim 15, wherein establishing the measurement period in the digital thermometer comprising counting a number of cycles of the first clock signal and comparing the number of cycles of the first clock signal to a trim setting representing the fixed number of cycles.

19. The memory device of claim 15, wherein calibrating the number of cycles of the second clock signal comprises adding an offset compensation value to the number of cycles of a second clock signal during the measurement period to generate an intermediate calibration result, and multiplying the intermediate calibration result by a slope calibration value to generate the value representing the temperature.

20. The memory device of claim 15, wherein the digital thermometer is disposed within the memory device, and wherein the thermometer is to perform operations further comprising:

providing the value representing the temperature to the control logic, wherein the control logic is to configure one or more operating parameters of the memory device based on the temperature.

* * * * *